(12) United States Patent
Hsu et al.

(10) Patent No.: US 11,664,770 B2
(45) Date of Patent: May 30, 2023

(54) METHOD AND ASSOCIATED CONTROLLER FOR IMPROVING TEMPERATURE ADAPTABILITY OF AMPLIFIER

(71) Applicant: MEDIATEK Inc., Hsin-Chu (TW)

(72) Inventors: Yu-Hao Hsu, Hsinchu (TW); Shan-Chi Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 316 days.

(21) Appl. No.: 17/030,454

(22) Filed: Sep. 24, 2020

(65) Prior Publication Data

US 2021/0135633 A1 May 6, 2021

Related U.S. Application Data

(60) Provisional application No. 62/927,754, filed on Oct. 30, 2019.

(51) Int. Cl.
*H03F 1/30* (2006.01)

(52) U.S. Cl.
CPC ......... *H03F 1/30* (2013.01); *H03F 2200/447* (2013.01); *H03F 2200/451* (2013.01); *H03F 2200/468* (2013.01)

(58) Field of Classification Search
CPC ........................................................ H03F 1/30
See application file for complete search history.

(56) References Cited

U.S. PATENT DOCUMENTS

| | | | | |
|---|---|---|---|---|
| 5,241,286 A | * | 8/1993 | Mirow | H03B 5/20 331/135 |
| 2004/0263247 A1 | * | 12/2004 | Doherty | H03F 1/30 330/129 |
| 2005/0088237 A1 | * | 4/2005 | Gamero | H03F 1/0222 330/289 |
| 2006/0214730 A1 | * | 9/2006 | Yamakawa | H03F 1/301 330/289 |
| 2013/0029617 A1 | * | 1/2013 | Guo | H03F 3/24 455/127.1 |
| 2016/0116287 A1 | * | 4/2016 | Fujii | G01C 19/5776 73/497 |
| 2018/0152785 A1 | * | 5/2018 | Yeoh | H03F 1/0216 |
| 2021/0210984 A1 | * | 7/2021 | Peralta | H02J 50/20 |

* cited by examiner

*Primary Examiner* — Patricia T Nguyen
(74) *Attorney, Agent, or Firm* — McClure, Qualey & Rodack, LLP

(57) ABSTRACT

The invention provides method and associated controller for improving temperature adaptability of an amplifier; the method may include: receiving a temperature value, and adjusting a supply voltage supplied to the amplifier according to the temperature value.

20 Claims, 4 Drawing Sheets

METHOD AND ASSOCIATED CONTROLLER FOR IMPROVING TEMPERATURE ADAPTABILITY OF AMPLIFIER

This application claims the benefit of U.S. provisional application Ser. No. 62/927,754, filed Oct. 30, 2019, the subject matter of which is incorporated herein by reference.

FIELD OF THE INVENTION

The present invention relates to method and associated controller for improving temperature adaptability of an amplifier, and more particularly, to method and controller improving temperature adaptability of the amplifier by adjusting a supply voltage supplied to the amplifier according to a temperature value.

BACKGROUND OF THE INVENTION

Radio-frequency (RF) circuitry for wireless communication, such as RF power amplifier for amplifying and outputting RF signal to antenna, is important and essential not only for telecommunication system (e.g., portable/handheld user equipment such as mobile phone or smart phone), but also for telematics system. However, handheld telecommunication system and telematics system have different standards to follow. For example, third Generation Partnership Project (3GPP) for mobile telecommunication requires a user equipment to satisfy some performance requirements over a temperature range −10 to 55° C., while Grade 3 of Automotive Electronics Council Q100 (AEC-Q100) demands electronics (including RF circuitry) in a telematics system to properly function over a much wider temperature range −40 to 85° C. In other words, RF circuitry for implementing 3GPP mobile telecommunication in a telematics system must meet the 3GPP performance requirements over the wider temperature range of AEC-Q100 grade 3. However, migrating from the narrower temperature range of 3GPP to the wider temperature range of AEC-Q100 grade 3 without degrading performances is challenging for development of RF circuitry.

SUMMARY OF THE INVENTION

Therefore, an objectivity of the invention is providing a method (e.g., 300 in FIG. 3) for improving temperature adaptability of RF circuitry, such as an amplifier (e.g., 120 in FIG. 1). The method may include steps (e.g., 304 and 306 in FIG. 3) of: receiving a temperature value (e.g., Ta in FIG. 1), and adjusting a supply voltage (e.g., Vpa in FIG. 1) supplied to the amplifier according to the temperature value.

In an embodiment, the temperature value may be derived from at least one of an ambient temperature (e.g., TS1 in FIG. 1) and a temperature of the amplifier (e.g., TS2 in FIG. 1).

In an embodiment (e.g., FIG. 3 and FIG. 4a or 4b), adjusting the supply voltage supplied to the amplifier according to the temperature value may include: when the temperature value is higher than a first temperature threshold (e.g., T1 in FIG. 3, 4a or 4b) and the supply voltage is not in a first voltage value (e.g., V1 in FIG. 3, 4a or 4b), adjusting the supply voltage to the first voltage value.

In an embodiment (e.g., FIG. 3 and FIG. 4a or 4b), adjusting the supply voltage supplied to the amplifier according to the temperature value may further include: when the temperature value is lower than a second temperature threshold (e.g., T2 in FIG. 3, 4a or 4b) and the supply voltage is not in a second voltage value (e.g., V2 in FIG. 3, 4a or 4b), adjusting the supply voltage to the second voltage value, wherein the second voltage value may be different from the first voltage value.

In an embodiment (e.g., FIG. 4a or 4b), the first temperature threshold may be higher than the second temperature threshold. In an embodiment (e.g., FIG. 4a or 4b), the first voltage value may be higher than the second voltage value.

In an embodiment (e.g., FIGS. 3 and 4b), adjusting the supply voltage supplied to the amplifier according to the temperature value may further include: when the temperature value is lower than a fourth temperature threshold (e.g., T4 in FIG. 3 or 4b) and the supply voltage is not in a third voltage value (e.g., V3 in FIG. 3 or 4b), adjusting the supply voltage to the third voltage value, wherein the fourth temperature threshold may be different from the first temperature threshold and the second temperature threshold.

In an embodiment (e.g., FIGS. 3 and 4b), adjusting the supply voltage supplied to the amplifier according to the temperature value may further include: when the temperature value is higher than a third temperature threshold (e.g., T3 in FIG. 3 or 4b) and the supply voltage is not in the second voltage value, adjusting the supply voltage to the second voltage value.

In an embodiment (e.g., FIG. 4b), the fourth temperature threshold may be lower than the third temperature threshold. In an embodiment (e.g., FIG. 4b), the third temperature threshold may be lower than the second temperature threshold.

In an embodiment (e.g., FIG. 1), the amplifier may be a power amplifier for amplifying a radio-frequency signal (e.g., s1 in FIG. 1) and outputting a resultant radio-frequency signal (e.g., s2 in FIG. 1) to an antenna (e.g., 122 in FIG. 1) of a system (e.g., 100 in FIG. 1), and the system may be a telematics system or a telecommunication system. In an embodiment, the telecommunication system may be a portable/handheld user equipment which is compliant with 2G, 3G, 4G or 5G system specified by third Generation Partnership Project (3GPP) standards.

An objectivity of the invention is providing a controller (e.g., 110 in FIG. 1) for an amplifier (e.g., 120); the controller may include a sensor port (e.g., 104) for receiving a temperature value (e.g., Ta), and an internal circuit (e.g., 106) coupled between the sensor port and a supply circuit (e.g., 112) which may manage a supply voltage (e.g., Vpa) supplied to the amplifier; wherein the internal circuit may drive the supply circuit to adjust the supply voltage when the temperature value is higher than a first temperature threshold (e.g., T1 in FIG. 3, 4a or 4b) or lower than a second temperature threshold (e.g., T2 in FIG. 3, 4a or 4b).

In an embodiment, the temperature value may be derived from at least one of an ambient temperature (e.g., TS1 in FIG. 1) and a temperature (e.g., TS2) of the amplifier by a temperature sensing module (e.g., 102 in FIG. 1). In an embodiment, the sensor port may be configured to receive the temperature value from the temperature sensing module, and the temperature sensing module may connect: an ambient temperature sensor (e.g., 124 in FIG. 1) for sensing the ambient temperature, and an amplifier temperature sensor (e.g., 126 in FIG. 1) for sensing the temperature of the amplifier.

In an embodiment (e.g., FIG. 3, 4a or 4b), the internal circuit may be configured to drive the supply circuit to adjust the supply voltage to a first voltage value (e.g., V1 in FIG. 3, 4a or 4b) when the temperature value is higher than the first temperature threshold. In an embodiment (e.g., FIG. 3, 4a or 4b), the internal circuit may be configured to drive the supply circuit to adjust the supply voltage to a second voltage value (e.g., V2 in FIG. 3, 4a or 4b) when the temperature value is lower than the second temperature threshold.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The invention may improve temperature adaptability of an RF circuit, e.g., may help an RF circuit, which is originally compliant to 3GPP performance requirements only over the narrower temperature range of 3GPP, to adapt to the wider temperature range of AEC-Q100 grade 3, so the RF circuit may remain compliant to the 3GPP performance requirements over the wider temperature range of AEC-Q100 grade 3. For convenience of discussion, RF power amplifier, as an example of RF circuit, is considered hereinafter.

Figure 1:
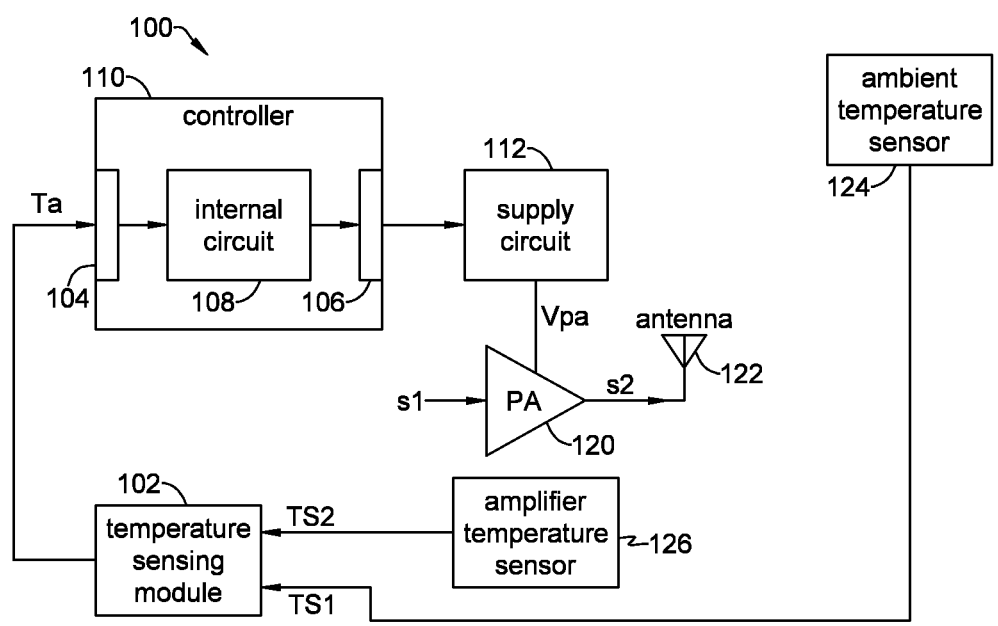
FIG. 1 depicts a system according to an embodiment of the invention which may include an amplifier supplied by a supply voltage.

FIG. 1 depicts a system 100 according to an embodiment of the invention; for example, the system 100 may be an electronic system which needs to satisfy 3GPP performance requirements over the temperature range of AEC-Q100 grade 3. The system 100 may be a telematics system for a vehicle, or a telecommunication system such as a portable/handheld user equipment which is compliant with 2G, 3G, 4G or 5G (or more advanced) system specified by 3GPP standards. The system 100 may include one or more temperature sensors, a temperature sensing module 102, a controller 110, a supply circuit 112, an amplifier 120 and an antenna 122. Said one or more temperature sensors may respectively sense one or more temperatures; the temperature sensing module 102 may connect said one or more temperature sensors, and may derive a temperature value Ta from said one or more temperatures sensed by said one or more temperature sensors. For example, as shown in FIG. 1, said one or more temperature sensors may include an ambient temperature sensor 124 and an amplifier temperature sensor 126. The ambient temperature sensor 124 may sense an ambient temperature TS1 of the system 100. The amplifier temperature sensor 126 may be disposed near the amplifier 120, and may sense a temperature TS2 of the amplifier 120. The temperature sensing module 102 may connect the ambient temperature sensor 124 and the amplifier temperature sensor 126, and may derive a temperature value Ta from the ambient temperature TS1 and the temperature TS2 of the amplifier 120; for example, the temperature value Ta may be a weighted average of the temperatures TS1 and TS2.

The controller 110 may include a sensor port 104, a power control port 106 and an internal circuit 108. The sensor port 104 may be coupled to the temperature sensing module 102 to receive the temperature value Ta. The power control port 106 may be coupled to the supply circuit 112. The internal circuit 108 may be coupled to the sensor port 104 and the power control port 106. The supply circuit 112 may be coupled between the power control port 106 and the amplifier 120, and may manage a DC (direct-current) supply voltage Vpa supplied to the amplifier 120. In an embodiment, the controller 110 may be implemented by logic circuit in an integrated circuit (IC), e.g., a processor IC; and the supply circuit 112 may be in a different IC, such as a power management IC (PMIC). In an embodiment, the controller 110 and the supply circuit 112 may be integrated into a same IC. In an embodiment, the temperature sensing module 102 and the controller 110 may be integrated in a same IC; in a different embodiment, the temperature sensing module 102 and the controller 110 may respectively be disposed in two different ICs.

The amplifier 120 may be an RF power amplifier (PA). Being coupled to the supply circuit 112 and supplied by the supply voltage Vpa, the amplifier 120 may receive a wired RF signal s1 (e.g., from an RF front stage circuit, not shown), amplify power of the RF signal s1 to generate an amplified RF signal s2, and output the amplified RF signal s2 to the antenna 122 to be transmitted by electromagnetic waves.

In other words, the amplifier 120 may function as the final stage of an RF transmitter for the system 100; overall RF transmission performances of the system 100, such as RF transmission power at different frequencies (channels), may therefore be dominated by performances of the amplifier 120. Regarding RF transmission power, 3GPP describes (e.g., in 3GPP TS 25.101, 25,102, 34.121, 34.122, 36.101, 36.521-1, 38.101-1, 45.005, 45.008, 45.010 and/or 51.010-1) performance requirements related to UE maximum output power, spectrum emission mask (SEM) and adjacent channel leakage power ratio (ACLR), etc. For example, to achieve high quality telecommunication, ACLR should be kept low, the lower the better.

Figure 2A:
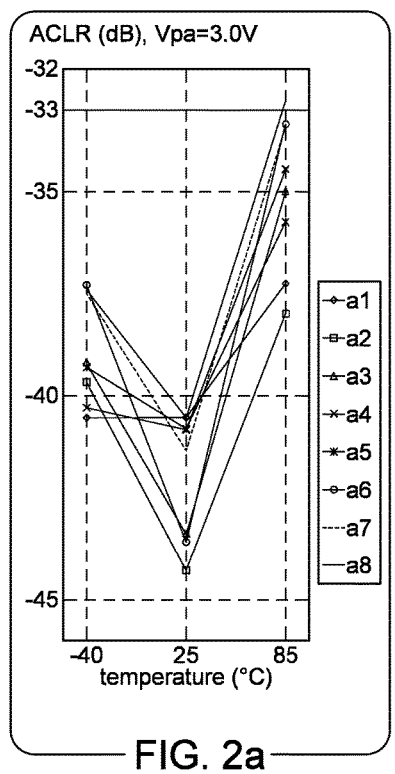
FIGS. 2a and 2b depict how performance varies with temperature at different communication channels when supply voltage is fixed over entire temperature range.

FIG. 2a depicts eight curves a1 to a8 sampling how ACLR of the amplifier 120 varies with temperature respectively at eight different communication channels f1 to f8 in a band (e.g., uplink band, not shown) when the supply voltage Vpa is fixed to 3.0 Volts over the entire temperature range of the AEC-Q100 grade 3. For example, with the supply voltage Vpa constantly set to 3.0 Volts over the entire temperature range of the AEC-Q100 grade 3, the curve a1 shows that, at the channel f1 ACLR is below −40 dB at low temperature (e.g., −40° C., the lower bound of the temperature range of AEC-Q100 grade 3) and normal temperature (e.g., 25° C.) but rises to a higher value between −40 dB and −35 dB at high temperature (e.g., 85° C., the upper bound of the temperature range of AEC-Q100 grade 3); for another example, with the supply voltage Vpa constantly set to 3.0 Volts over the temperature range of AEC-Q100 grade 3, i.e., −40 to 85° C., the curve a2 shows that, at the channel f2, ACLR is close to −40 dB at low temperature, nearly reaches −45 dB at normal temperature, and rises back to a value between −40 dB and −35 dB at high temperature.

To satisfy 3GPP performance requirements over the temperature range of AEC-Q100 grade 3, ACLR needs to remain lower than an ACLR threshold, e.g., −33 dB, at each of the eight different channels f1 to f8 over the temperature range of AEC-Q100 grade 3, the lower the better. However, as shown by the curve a8 in FIG. 2a, at the channel f8, ACLR will exceed the ACLR threshold at high temperature when the supply voltage Vpa is fixed to 3.0 Volts.

Figure 2B:
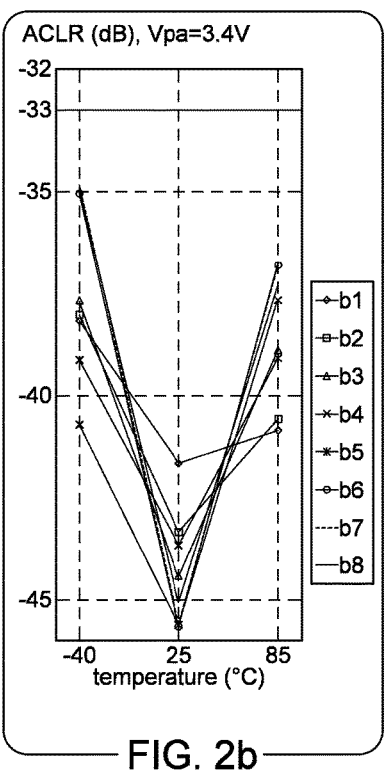

ACLR may be improved (e.g., be lowered) by adjusting (e.g., increasing) the supply voltage Vpa, since ACLR relates to linearity of amplification gain. FIG. 2b depicts eight curves b1 to b8 sampling how ACLR of the amplifier 120 varies with temperature respectively at the eight different channels f1 to f8 when the supply voltage Vpa is fixed to 3.4 Volts over the temperature range of AEC-Q100 grade 3. For example, with the supply voltage Vpa fixed to 3.4 Volts over the temperature range of AEC-Q100 grade 3, the curve b8 shows that, at the channel f8, ACLR is close to −35 dB at low temperature (e.g., −40° C.), lower than −45 dB at normal temperature (e.g., 25° C.), and rises to a higher value between −40 dB and −35 dB at high temperature (e.g., 85° C.). As shown in FIG. 2b, by keeping the supply voltage Vpa fixed to a higher 3.4 Volts over the temperature range of AEC-Q100 grade 3, ACLR at each of the channels f1 to f8 may be kept under the −33 dB ACLR threshold over the entire temperature range of AEC-Q100 grade 3. However, the margin between the −33 dB ACLR threshold and the worst-case ACLR (e.g., −35 dB at the channel f8 and low temperature −40° C., as indicated by the curve b8) will be unsatisfactorily insufficient. Comparing FIGS. 2a and 2b, it is understood that: setting the supply voltage Vpa of the amplifier 120 (FIG. 1) fixed to a higher voltage value over the entire temperature range of AEC-Q100 grade 3 may improve performances (not only ACLR but also SEM and maximum output power, though not shown) at high temperature (e.g., 85° C.), but may degrade performances at low temperature (e.g., −40° C.) on the other hand.

Figure 3:
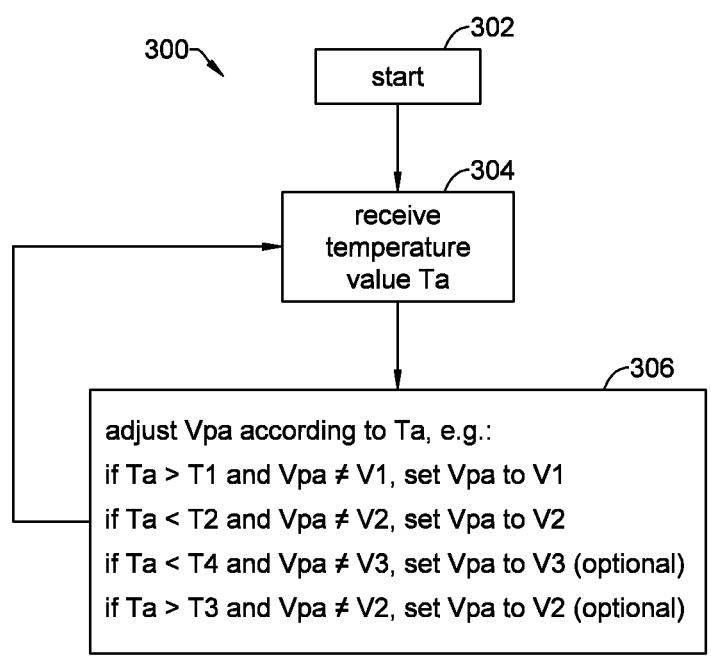
FIG. 3 depicts a flowchart according to an embodiment of the invention.

To overcome disadvantages of constantly setting the voltage Vpa to a fixed voltage value over the entire temperature range, the invention provides a temperature compensated voltage setting which may dynamically adjust the supply voltage Vpa of the amplifier 120 (FIG. 1) according to the temperature value Ta. Along with FIG. 1, FIG. 3 depicts a flowchart 300 according to an embodiment of the invention; the internal circuit 108 (FIG. 1) may be configured to execute the flowchart 300 to implement the temperature compensated voltage setting for the amplifier 120. Executing the flowchart 300 may improve performances, including ACLR, of the amplifier 120 over the entire temperature range of AEC-Q100 grade 3, and may therefore improve temperature adaptability of the amplifier 120 (and the system 100). The flowchart 300 may include steps 302, 304 and 306. At step 302, the internal circuit 108 may start the flowchart 300. At step 304, the internal circuit 108 may receive the temperature value Ta from the temperature sensing module 102. At step 306, the internal circuit 108 may dynamically adjust the voltage Vpa supplied to the amplifier 120 according to the temperature value Ta. After step 306, the flowchart 300 may iterate back to step 304 to keep on receiving updated temperature value Ta. Along with FIGS. 1 and 3, each of FIGS. 4a and 4b depicts an embodiment of the temperature compensated voltage setting which may be adopted at step 306.

Figure 4A:
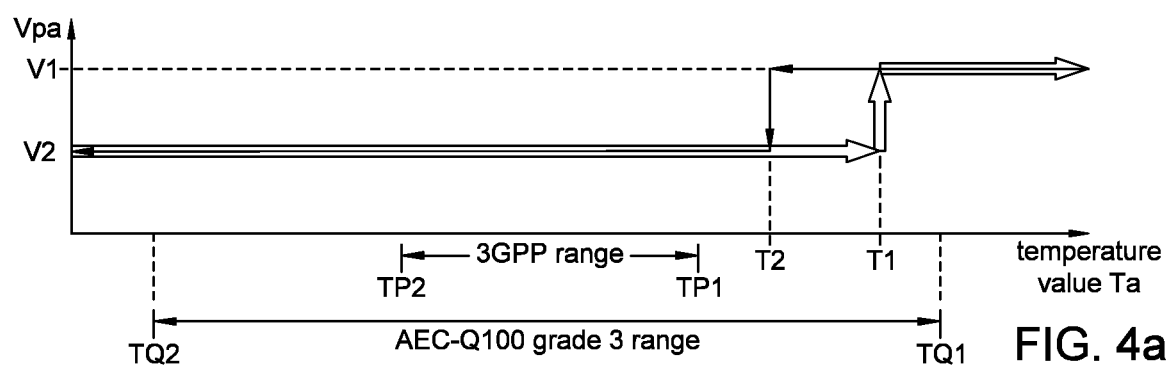
FIGS. 4a and 4b depict temperature compensated voltage setting according to embodiments of the invention.
Figure 4B:
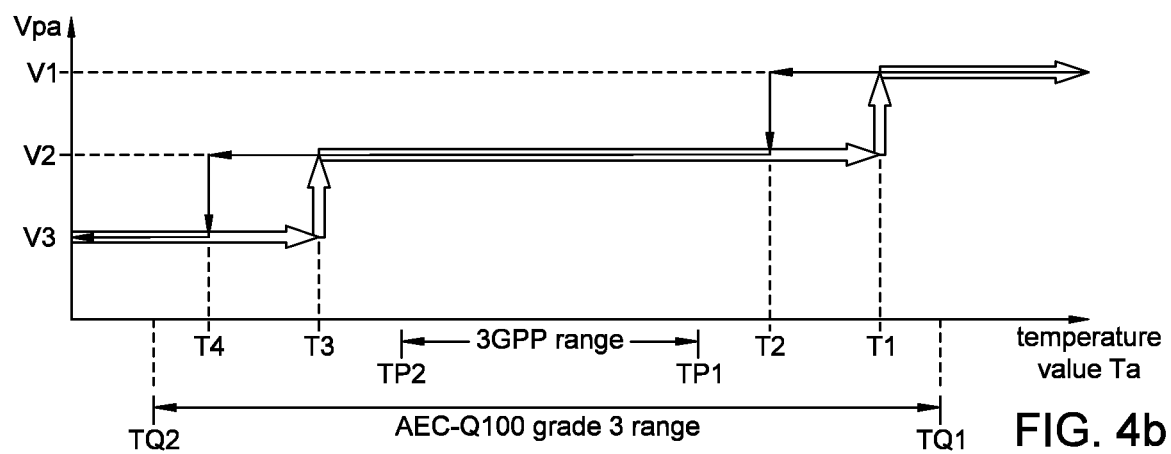

As shown in FIG. 4a or 4b, according to an embodiment of the invention, at step 306, the internal circuit 108 may drive the supply circuit 112 to adjust the supply voltage Vpa when the temperature value Ta is higher than a first temperature threshold T1 or lower than a second temperature threshold T2. For example, at step 306, the internal circuit 108 may drive the supply circuit 112 to adjust the supply voltage Vpa when the temperature value Ta rises across the temperature threshold T1, and may drive the supply circuit 112 to adjust the supply voltage Vpa when the temperature value Ta falls across the temperature threshold T2. As shown in FIG. 4a or 4b, according to an embodiment of the invention, at step 306, when the temperature value Ta is higher than the temperature threshold T1 and the supply voltage Vpa is not in a first voltage value V1, the internal circuit 108 may drive the supply circuit 112 to adjust the supply voltage Vpa to the first voltage value V1; when the temperature value Ta is lower than the temperature threshold T2 and the supply voltage Vpa is not in a second voltage value V2, the internal circuit 108 may drive the supply circuit 112 to adjust the supply voltage Vpa to the voltage value V2.

As shown in FIG. 4a or 4b, in an embodiment, the voltage value V1 may be higher than the voltage value V2, and the temperature thresholds T1 and T2 may be different; for example, the temperature threshold T1 may be higher than the temperature threshold T2. As shown in FIG. 4a or 4b, in an embodiment, the temperature thresholds T1 and T2 may be higher than an upper bound TP1 of the temperature range of 3GPP, but may be lower than an upper bound TQ1 of the temperature range of AEC-Q100 grade 3. For example, in an embodiment, as the upper bounds TP1 and TQ1 may be 55 and 85° C., the temperature thresholds T1 and T2 may be respectively set to 75 and 70° C.

As shown in FIG. 4b, according to an embodiment of the invention, at step 306, when the temperature value Ta is lower than a fourth temperature threshold T4 and the supply voltage Vpa is not in a third voltage value V3, the internal circuit 108 may further drive the supply circuit 112 to adjust the supply voltage Vpa to the third voltage value V3; when the temperature value Ta is higher than a third temperature threshold T3 and the supply voltage Vpa is not in the second voltage value V2, the internal circuit 108 may further drive the supply circuit 112 to adjust the supply voltage Vpa to the second voltage value V2. As shown in FIG. 4b, in an embodiment, the voltage value V2 may be higher than the voltage value V3, and the temperature thresholds T3 and T4 may be different; for example, the fourth temperature threshold T4 may be lower than the third temperature threshold T3. As shown in FIG. 4b, in an embodiment, the temperature threshold T3 may be lower than the temperature threshold T2, and a relation of the temperature thresholds T1 to T4 may be: T1>T2>T3>T4. As shown in FIG. 4b, in an embodiment, the temperature thresholds T3 and T4 may be higher than a lower bound TQ2 of the temperature range of AEC-Q100 grade 3, but may be lower than a lower bound TP2 of the temperature range of 3GPP. For example, in an embodiment, as the lower bounds TQ2 and TP2 may be −40 and −10° C., the temperature thresholds T3 and T4 may be respectively set to −20 and −25° C.

Figure 2C:
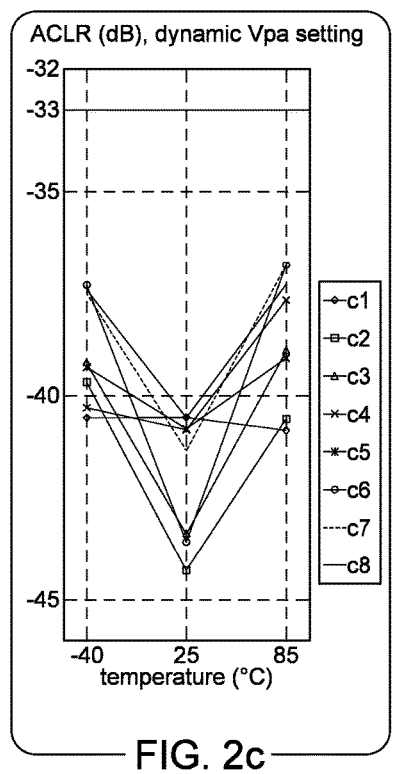
FIG. 2c depicts how performance varies with temperature at different communication channels when supply voltage is dynamically adjusted according to temperature.

Along with FIGS. 1, 3, 4a and 4b, FIG. 2c depicts eight curves c1 to c8 sampling how ACLR of the amplifier 120 varies with temperature respectively at the eight different channels f1 to f8 when the supply voltage Vpa supplied to the amplifier 120 (FIG. 1) is dynamically set according to FIGS. 3 and e.g., 4a; for example, the voltage Vpa may be set to 3.0 Volts (i.e., V2=3.0) at low and normal temperatures, but be set to higher 3.4 Volts (i.e., V1=3.4) at high temperature. As all the eight curves c1 to c8 in FIG. 2c show, by applying the temperature compensated voltage setting of the invention, ACLR at all the channels f1 to f8 may be kept below the −33 dB ACLR threshold with sufficient margin over the entire temperature range of AEC-Q100 grade 3. Though not depicted, the temperature compensated voltage setting of the invention may also improve performances other than ACLR, such as SEM and maximum output power, over the entire temperature range of AEC-Q100 grade 3.

To sum up, setting a supply voltage of an RF power amplifier to a fixed constant value over entire temperature range will degrade performances of transmission (e.g., either at high or low temperature); comparing to such temperature-independent voltage setting, the temperature compensated voltage setting of the invention may dynamically adjust the supply voltage in response to temperature, and may therefore improve performances of transmission over entire temperature range.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method comprising:
   receiving a temperature value; and
   when the temperature value is higher than a first temperature threshold and a supply voltage supplied to an amplifier is lower than a first voltage value, increasing the supply voltage to the first voltage value by a circuit.

2. The method of claim 1, wherein the temperature value is derived from at least one of an ambient temperature and a temperature of the amplifier.

3. The method of claim 1 further comprising:
   when the temperature value falls across the first temperature threshold, keeping the supply voltage to remain in the first voltage value.

4. The method of claim 1 further comprising:
   when the temperature value is lower than a second temperature threshold and the supply voltage is not in a second voltage value, adjusting the supply voltage to the second voltage value;
   wherein the second voltage value is different from the first voltage value.

5. The method of claim 4, wherein the first temperature threshold is higher than the second temperature threshold.

6. The method of claim 4 further comprising:
   when the temperature value is lower than a fourth temperature threshold and the supply voltage is not in a third voltage value, adjusting the supply voltage to the third voltage value;
   wherein the fourth temperature threshold is different from the first temperature threshold and the second temperature threshold.

7. The method of claim 6 further comprising:
   when the temperature value is higher than a third temperature threshold and the supply voltage is not in the second voltage value, adjusting the supply voltage to the second voltage value.

8. The method of claim 7, wherein the fourth temperature threshold is lower than the third temperature threshold.

9. The method of claim 7, wherein the third temperature threshold is lower than the second temperature threshold.

10. The method of claim 4, wherein:
    the second voltage value is lower than the first voltage value.

11. The method of claim 1, wherein the amplifier is a power amplifier for amplifying and outputting a radio-frequency signal to an antenna of a telematics system or a telecommunication system.

12. The method of claim 11, wherein the telecommunication system is a portable/handheld user equipment which is compliant with 2G, 3G, 4G or 5G system specified by third Generation Partnership Project (3GPP) standards.

13. A method comprising:
    receiving a temperature value; and
    when the temperature value rises across a first temperature threshold, changing a supply voltage supplied to an amplifier from a second voltage value to a first voltage value by a circuit; and
    when the temperature value falls across the first temperature threshold, keeping the supply voltage in the first voltage value; wherein:
    the first voltage value and the second voltage value are different.

14. The method of claim 13, wherein the temperature value is derived from at least one of an ambient temperature and a temperature of the amplifier by a temperature sensing module.

15. The method of claim 14, wherein the temperature sensing module connects:
    an ambient temperature sensor for sensing the ambient temperature, and
    an amplifier temperature sensor for sensing the temperature of the amplifier.

16. The method of claim 13, wherein the first voltage value is higher than the second voltage value.

17. The method of claim 13 further comprising:
    changing the supply voltage to the second voltage value when the temperature value is lower than a second temperature threshold.

18. The method of claim 17, wherein the second temperature threshold is lower than the first temperature threshold.

19. The method of claim 13, wherein the amplifier is a power amplifier for amplifying and outputting a radio-frequency signal to an antenna of a telematics system or a telecommunication system.

20. The method of claim 19, wherein the telecommunication system is a portable/handheld user equipment which is compliant with 2G, 3G, 4G or 5G system specified by third Generation Partnership Project (3GPP) standards.

* * * * *